US009990580B2

(12) United States Patent
Eleftheriou et al.

(10) Patent No.: US 9,990,580 B2
(45) **Date of Patent: *Jun. 5, 2018**

(54) NEUROMORPHIC SYNAPSES

(71) Applicant: International Business Machines Corporation, Armonk, NY (US)

(72) Inventors: Evangelos S. Eleftheriou, Rueschlikon (CH); Manuel Le Gallo, Rueschlikon (CH); Angeliki Pantazi, Rueschlikon (CH); Abu Sebastian, Rueschlikon (CH); Tuma Tomas, Rueschlikon (CH)

(73) Assignee: International Business Machines Corporation, Armonk, NY (US)

( * ) Notice: Subject to any disclaimer, the term of this patent is extended or adjusted under 35 U.S.C. 154(b) by 516 days.

This patent is subject to a terminal disclaimer.

(21) Appl. No.: 14/657,628

(22) Filed: Mar. 13, 2015

(65) Prior Publication Data

US 2016/0267378 A1 Sep. 15, 2016

(51) Int. Cl.
*G06N 3/06* (2006.01)
*G06N 3/063* (2006.01)
(Continued)

(52) U.S. Cl.
CPC ........... *G06N 3/0635* (2013.01); *G06N 3/049* (2013.01); *G06N 3/063* (2013.01); *G06N 3/08* (2013.01);
(Continued)

(58) Field of Classification Search
None
See application file for complete search history.

(56) References Cited

U.S. PATENT DOCUMENTS 8,275,727 B2 9/2012 Elmegreen et al.
8,433,665 B2 4/2013 Tang et al.
(Continued)

OTHER PUBLICATIONS

Cai et al., "Neuronal Synapse as a Memristor: Modeling Pair—and Triplet-Based STDP Rule", IEEE Transactions on Biomedical Circuits and Systems, vol. 9, No. 1, Jun. 20, 2014, Feb. 2015, pp. 87-95.
(Continued)

*Primary Examiner* — Alan Chen
(74) *Attorney, Agent, or Firm* — Scully, Scott, Murphy & Presser, P.C.; Daniel P. Morris, Esq.

(57) ABSTRACT

Neuromorphic synapse apparatus 11 comprises a memelement 20 for storing a synaptic weight, and programming logic 21. The memelement 20 is adapted to exhibit a desired programming characteristic. The programming logic 21 is responsive to a stimulus prompting update of the synaptic weight for generating a programming signal for programming the memelement 20 to update said weight. The programming logic 21 may be responsive to an input signal indicating an input weight-change value $\Delta W_i$, and may be adapted to generate a programming signal dependent on the input weight-change value $\Delta W_i$. The programming logic 21 is adapted such that the programming signals exploit the programming characteristic of the memelement 20 to provide a desired weight-dependent synaptic update efficacy.

17 Claims, 10 Drawing Sheets

(51) Int. Cl.
*G06N 3/08* (2006.01)
*G06N 3/04* (2006.01)
*G11C 11/54* (2006.01)
*G11C 11/56* (2006.01)
*G11C 13/00* (2006.01)

(52) U.S. Cl.
CPC .......... *G11C 11/54* (2013.01); *G11C 11/5678* (2013.01); *G11C 13/0004* (2013.01); *G11C 13/004* (2013.01); *G11C 13/0069* (2013.01); *G11C 2013/0092* (2013.01)

(56) References Cited

U.S. PATENT DOCUMENTS

| | | | | |
|---|---|---|---|---|
| 8,447,714 | B2 | 5/2013 | Breitwisch et al. | |
| 8,682,822 | B2 | 3/2014 | Modha et al. | |
| 2012/0084241 | A1 | 4/2012 | Friedman et al. | |
| 2013/0132314 | A1 | 5/2013 | Snider | |
| 2015/0278682 | A1* | 10/2015 | Saxena | G06N 3/049 706/23 |

OTHER PUBLICATIONS

Bill et al., "A compound memristive synapse model for statistical learning through STDP in spiking neural networks", Frontiers in Neuroscience, vol. 8, Dec. 16, 2014.

Zhang et al., "Implementation of Memristive Neural Networks with Spike-rate-dependent Plasticity Synapses", Proceedings of the 2014 International Joint Conference on Neural Networks (IJCNN'14), Jul. 6, 2014, pp. 2226-2233.

Serrano-Gotarredona et al., "A Proposal for Hybrid Memristor-CMOS Spiking Neuromorphic Learning Systems", IEEE Circuits and Systems Magazine, vol. 13, No. 2, May 22, 2013, pp. 74-88.

Bamford et al., "Spike-Training-Dependent Plasticity With Weight Dependence Evoked From Physical Constraints", IEEE Transactions on Biomedical Circuits and Systems, vol. 6, No. 4, Feb. 23, 2012, pp. 385-398.

International Search Report dated Jun. 1, 2016 PCT/EP2016/055098.

Eryilmaz et al., "Experimental Demonstration of Array-level Learning with Phase Change Synaptic Devices," Electron Devices Meeting (IEDM), 2013 IEEE International, Dec. 9-11, 2013, pp. 1-5.

Kuzum et al., "Energy Efficient Programming of Nanoelectronic Synaptic Devices for Large-Scale Implementation of Associative and Temporal Sequence Learning," Electron Devices Meeting (IEDN), 2011 IEEE International, Dec. 5-7, 2011, pp. 3.3.1-30.3.4.

Lu et al., "Two-Terminal Resistive Switches (Memristors) for Memory and Logic Applications," Design Automation Conference (ASP-DAC), 2011 16th Asia and South Pacific, Jan. 25-28, 2011pp. 217-223.

Yu et al., "Design Considerations of Synaptic Device for Neuromorphic Computing," Circuits and Systems (ISCAS), 2014 IEEE International Symposium on, Jun. 1-5, 2014, pp. 1062-1065.

List of IBM Patents or Patent Applications Treated as Related.

* cited by examiner

Two-Dimensional Synaptic Dynamics

NEUROMORPHIC SYNAPSES

This invention relates generally to neuromorphic synapses, providing neuromorphic synapse apparatus and methods for production thereof.

Neuromorphic technology relates to computing systems which are inspired by biological architectures of the nervous system. Conventional computing architectures are becoming increasingly inadequate to meet the ever-expanding processing demands placed on modern computer systems. Compared to the human brain, the classical von Neumann computer architecture is highly inefficient in terms of power consumption and space requirements. The human brain occupies less than 2 liters and consumes around 20 W of power. Simulating 5 seconds of brain activity using state-of-the-art supercomputers takes around 500 s and needs 1.4 MW of power. These issues have prompted a significant research effort to understand the highly efficient computational paradigm of the human brain and to create artificial cognitive systems with unprecedented computing power.

Neurons and synapses are two basic computational units in the brain. A neuron can integrate inputs coming from other neurons, in some cases with further inputs, for example from sensory receptors, and generates output signals known as "action potentials" or "spikes". The synapses change their connection strength as a result of neuronal activity. FIG. 1 of the accompanying drawings shows a schematic representation of a synapse 1 located between two neurons 2. The synapse 1 receives action potentials generated by a pre-synaptic neuron ("pre-neuron") N1 and provides output signals to a post-synaptic neuron ("post-neuron") N2. The pre-neuron action potential is conveyed to synapse 1 via an axon 3 of neuron N1. The resulting synaptic output signal is a graded synaptic potential which depends on conductance (also known as "synaptic weight") of the synapse. Synaptic weight can be enhanced or reduced by neuronal activity, and this "plasticity" of synapses is crucial to memory and other brain functions. This effect is indicated in FIG. 1 by back-propagation of the post-neuron action potential, i.e. a spike generated by neuron N2, to the synapse 1 via a dendrite 4 of neuron N2.

The action potentials in biological systems have the same shape at all instances of neuronal firing (spike generation). There is no information in the spike shape but only in the firing time. In particular, synaptic weight can be modified in dependence on relative timing of the pre-neuron and post-neuron action potentials. In a simple model here, synapses become increasingly stronger (more conductive) if the pre- and post-neurons fire together. Change in synaptic weight may also depend on slight differences in timing of the pre- and post-neuron spikes. For example, synaptic weight may increase if the post-neuron tends to fire just after the pre-neuron, and decrease if the post-neuron tends to fire just before the pre-neuron. These relative timing effects are known generally as spike-timing dependent plasticity (STDP). STDP is considered to be one of the important mechanisms underlying dynamic learning and the formation of memory in biological systems.

Devices with memristive, memcapacitive and meminductive properties have been proposed as suitable candidates for use in neural computation systems. Such memristors, memcapacitors and meminductors, collectively referred to as "memelements", are discussed, for example, in: "Circuit elements with memory: memristors, memcapacitors, and meminductors", Di Ventra, et al., Proceedings of the IEEE, 97(10), pp. 1717-1724, 2009; and "Advances in Neuromorphic Memristor Science and Applications", 2012, Editors Kozma, Pino and Pazienza, Springer Series in Cognitive and Neural Systems, Volume 4, pp 15-36, Di Ventra & Pershin. Memelements are non-volatile memory devices that can be programmed to different internal states which exhibit different electrical properties, specifically different resistance in the case of memristors, different capacitance in memcapacitors, and different inductance in meminductors. The state of a memelement can be programmed by application of current or voltage signals to the device. The internal state resulting from a programming signal can be measured (or "read") by making a measurement indicative of the device resistance, capacitance or inductance as appropriate. It is a property of memelements that the resulting internal state depends on the history of the device, i.e. the history of applied signals and the states through which the device has progressed. The particular way in which the read metric varies in response to programming signals (e.g. with one or more variable features such as number of programming pulses, pulse amplitude, duration, applied power, etc.,) defines the programming characteristic of the device.

Many examples of memelements exist at nanoscale dimensions. Resistive memory cells such as phase-change memory (PCM) cells provide well-known examples of nanoelectronic memristors. It has been shown that such memelements can emulate important aspects of synapse operation. The programmed state of the memelement provides an analogy for synaptic weight. By programming of the memelement in dependence on pre- and post-neuron action signals, the synaptic weight can be updated to provide for spike-timing dependent plasticity. Examples of such systems are described in: "Nanoelectronic Programmable Synapses Based on Phase Change Materials for Brain-Inspired Computing", Kuzum et al, Nanoletters, 12, pp. 2179, 2011; "Nanoscale Electronic Synapses Using Phase Change Devices", Jackson et al, ACM Journal on Emerging Technologies in Computing Systems, vol. 9(2), 2013; and "Experimental Demonstration of Array-level Learning with Phase Change Synaptic Devices", Eryilmaz et al., Proc. IEDM, 2013.

Another key aspect of synaptic plasticity is dynamic synaptic update efficacy. The update efficacy of a synapse is defined by the extent to which synaptic weight changes in response to a given stimulus. For example, consider that the pre-synaptic and post-synaptic neurons fire repeatedly with a fixed, small time delay. With simple STDP, this would result in a repeated, fixed amount of potentiation (weight increase) or depression (weight decrease) in the synapse. In real systems, of course, in order to keep the synaptic weight within bounds, the actual effect of these modifications should decrease or cease as the weight range limits of the synapse are approached or exceeded respectively. To achieve this, the synapse has to implement a rule which relates its weight update efficacy to its actual state, providing for weight-dependent synaptic update efficacy (which may also be termed "weight-dependent plasticity"). Research in theoretical neuroscience has shown that the exact form of this rule is essential for the computational properties of neural networks, and that crude rules such as hard-clipping can prevent correct computation and lead to wrong results. Weight dependence of temporally asymmetric Hebbian STDP in neuroscience is discussed in "Competitive Hebbian learning through spike-timing-dependent synaptic plasticity", Song et al., Nature Neuroscience, 3(9), pp. 919-926, 2000. However, implementing more sophisticated synaptic weight update rules poses a significant challenge for the technological realization of neuromorphic synapses, making their implementation even more complex and costly. Using CMOS circuitry for implementation of the synapse, "Spike-timing-dependent plasticity with weight dependence evoked from physical constraints, Bamford et al., IEEE Transactions on Biomedical Circuits and Systems, 6(4), pp. 385-398, 2012, discusses how physical constraints on the transistors can provide some weight-dependence of the STDP. Such systems have adverse implications for complexity, power consumption and areal density of nanoscale synapse systems.

An embodiment of a first aspect of the present invention provides neuromorphic synapse apparatus comprising:

a memelement for storing a synaptic weight, the memelement being adapted to exhibit a desired programming characteristic; and programming logic, responsive to a stimulus prompting update of the synaptic weight, for generating a programming signal for programming the memelement to update said weight;

wherein the programming logic is adapted such that the programming signals exploit said programming characteristic to provide a desired weight-dependent synaptic update efficacy.

By using a memelement adapted to provide a particular programming characteristic, together with programming logic configured in dependence on this characteristic to generate appropriate programming signals, synapse apparatus embodying the invention may be adapted to provide a desired weight-dependent synaptic update efficacy. In providing the desired weight-dependence, the programming logic may exploit the inherent feedback property of the internal physical state in memelements. This arises because the evolution of internal state depends on the current state and device history as discussed above. Embodiments of the invention may thus offer elegantly simple and efficient synapse implementations enabling synaptic weight update rules to be tuned according to requirements. Synapse apparatus embodying the invention may offers reduced implementation complexity, cost and areal requirements for nanoscale synapses with weight-dependent update efficacy.

In preferred embodiments, the stimulus prompting a synaptic weight update comprises an input signal indicating an input weight-change value, and the programming logic is adapted to generate a programming signal dependent on the input weight-change value. This may offer the advantage of fully-orthogonal implementation of STDP functionality and weight-dependent update efficacy in synapse operation. Synapse apparatus embodying the invention may therefore include STDP logic for receiving pre-neuron and post-neuron action signals. The STDP logic can be adapted to generate said input weight-change value in dependence on time-difference between the action signals, and provide the input signal to the programming logic. Such a configuration may offer flexible, fully-controlled synaptic dynamics, while the core synapse apparatus, comprising the memelement and programming logic, can be implemented as a simple two-terminal device. In particular, preferred apparatus includes an input terminal for receiving said input signal and an output terminal for providing a synaptic output signal dependent on said synaptic weight. The programming logic can be further adapted to control the memelement in a read mode for producing the synaptic output signal at the output terminal.

The programming signals may exploit the programming characteristic in various ways, e.g. by accessing a particular physical mechanism underlying some aspect of the characteristic, by utilizing a particular operating region of the characteristic, and/or by selecting a particular trajectory across the characteristic. For particularly convenient operation, each programming signal preferably comprises a respective set of $n \geq 1$ programming pulses, and the programming logic is adapted to control at least one of the programming pulse shape and the value of n to provide the desired weight-dependent synaptic update efficacy.

In some embodiments, the programming logic may be adapted such that the dependence of the programming signal on an input weight-change value varies in a predetermined manner over a plurality of input weight-change values so as to provide the desired weight-dependent synaptic update efficacy. Hence, the way in which a programming signal is produced for a given input weight-change value can vary with progress across the span of synaptic weights. Some weight-dependence can thus be built into the programming signal in addition to exploiting inherent weight-dependence in the programming characteristic. Advantageously, the programming logic can also be reconfigurable in response to a control signal for dynamically varying the desired weight-dependent synaptic update efficacy. This may allow dynamic tuning of the weight update efficacy according to the desired computational properties and the nature of input data in a given synapse system.

As illustrated below, the memelement can be adapted by means of various features to provide a particular programming characteristic, e.g. by virtue of element type, material, state-change mechanism, structure, shape, and configuration/properties of electrodes and/or other components of the element. At least one structural parameter, e.g. a material property, dimension, etc., may be modulated appropriately to provide a particular programming characteristic. Conveniently, the memelement may have a modulated shape to provide the desired characteristic. Alternatively, or in addition, other mechanisms can be exploited such as properties of a conductive component of a memristor based on a resistive memory cell. This is explained in more detail below.

Embodiments of the invention also provide a neuromorphic system comprising a pre-neuron circuit for generating a pre-neuron action signal, a post-neuron circuit for generating a post-neuron action signal, and synapse apparatus according to the first aspect of the invention. The synapse apparatus here includes an output terminal connected to the post-neuron circuit, and the programming logic is further adapted to control the memelement for producing a synaptic output signal, dependent on said synaptic weight, at the output terminal. The stimulus prompting update of the synaptic weight is dependent on the pre-neuron and post-neuron action signals here.

An embodiment of another aspect of the invention provides a method for producing neuromorphic synapse apparatus having a desired weight-dependent synaptic update efficacy. The method comprises:

providing a memelement for storing a synaptic weight, the memelement being adapted to exhibit a desired programming characteristic; and providing programming logic, responsive to a stimulus prompting update of the synaptic weight, for generating a programming signal for programming the memelement to update said weight;

wherein the method includes configuring the programming logic such that the programming signals exploit said programming characteristic to provide said desired weight-dependent synaptic update efficacy.

In general, where features are described herein with reference to an embodiment of one aspect of the invention, corresponding features may be provided in embodiments of another aspect of the invention.

Preferred embodiments of the invention will now be described, by way of example, with reference to the accompanying drawings in which.

Figure 5:
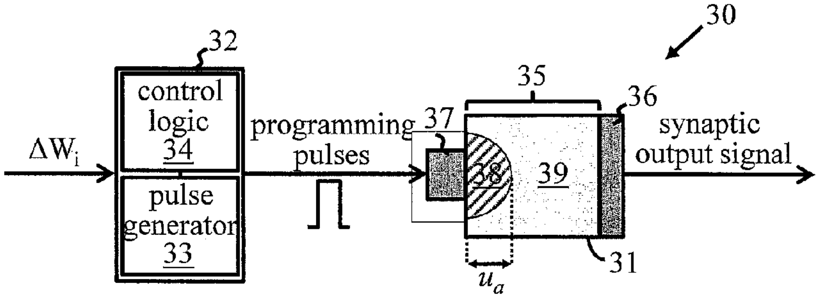
FIG. 5 shows an exemplary implementation of the FIG. 2 device.
Figure 6A:
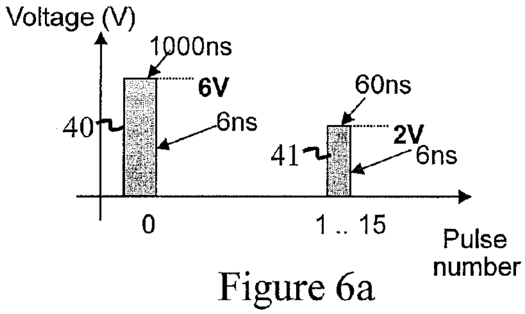
Figure 6B:
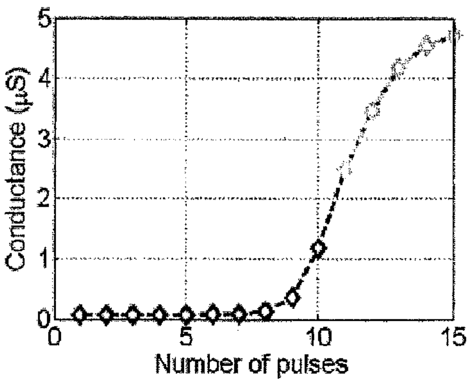
Figure 6C:
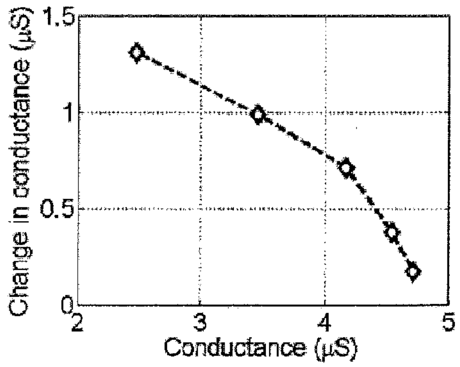
Figure 7A:
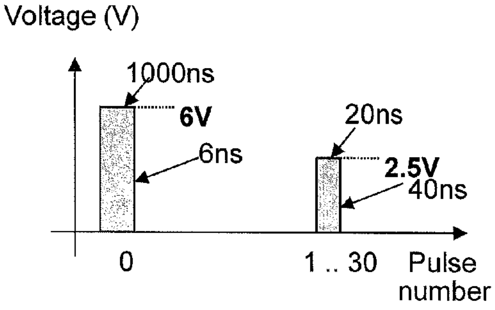
Figure 7B:
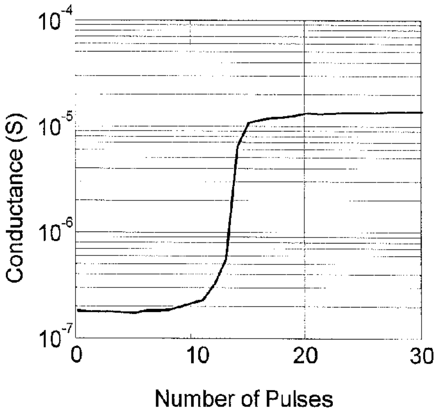
Figure 8:
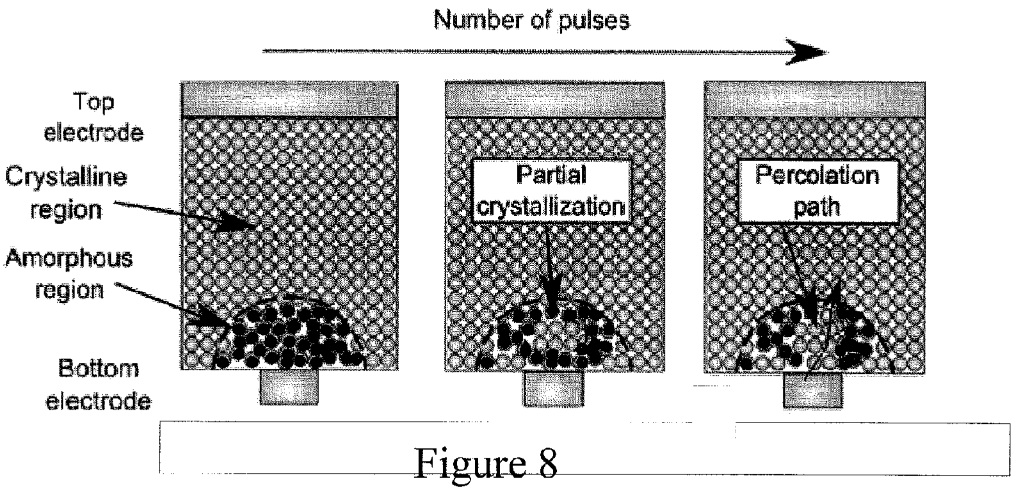
Figure 9:
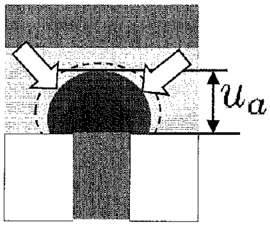
Figure 10A:
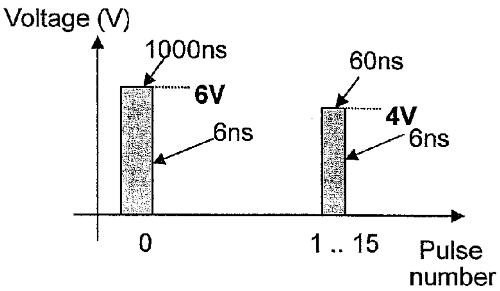
Figure 10B:
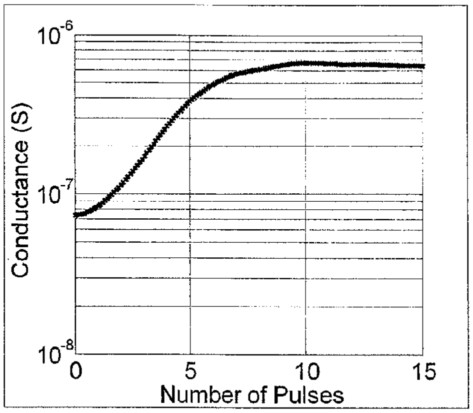
Figure 10C:
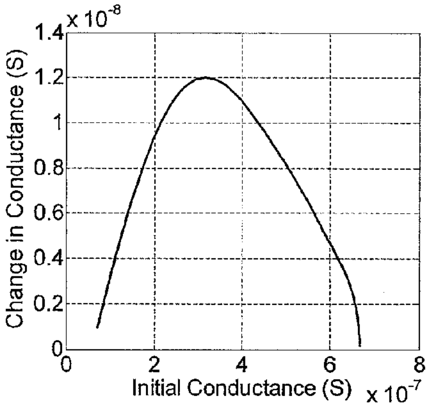
Figure 11A:
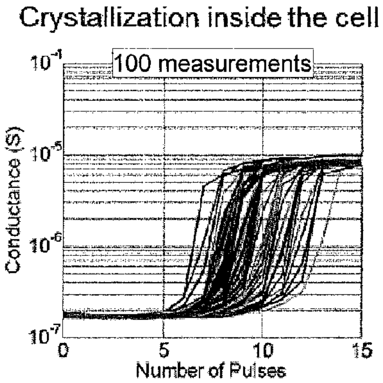
Figure 11B:
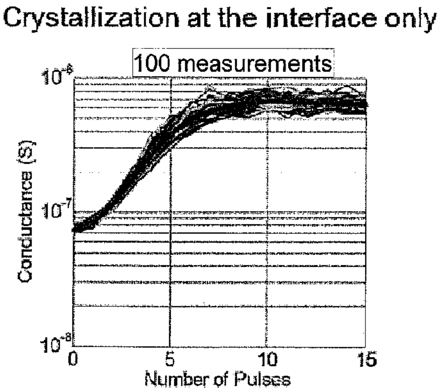
Figure 12:
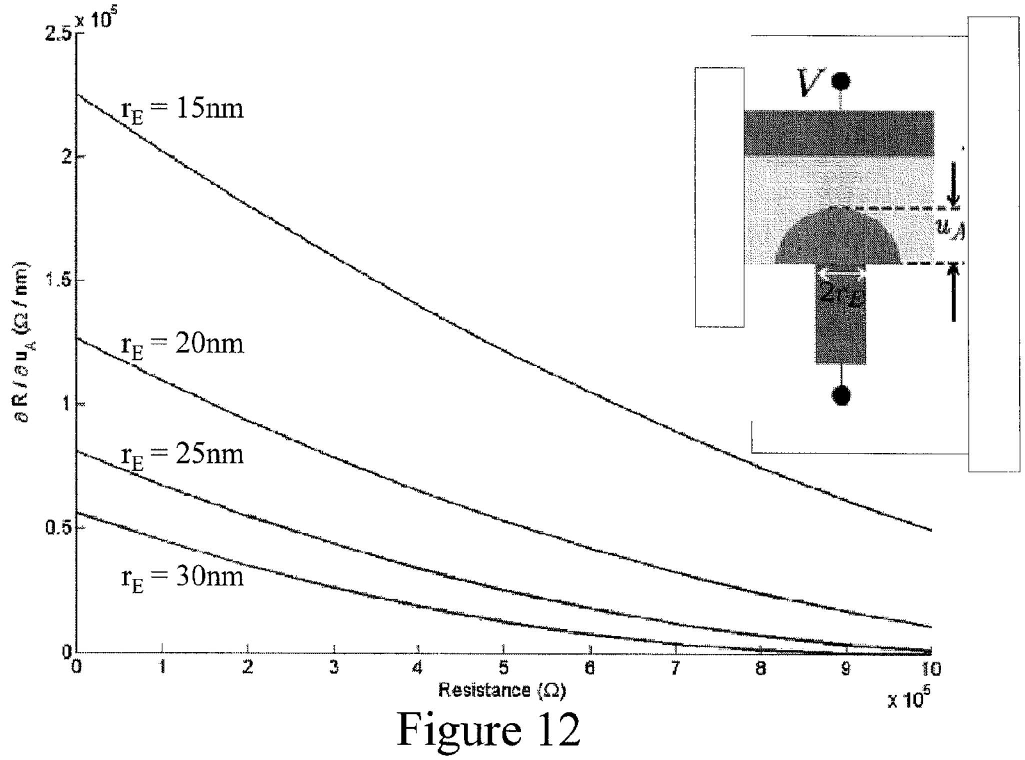
Figure 13A:
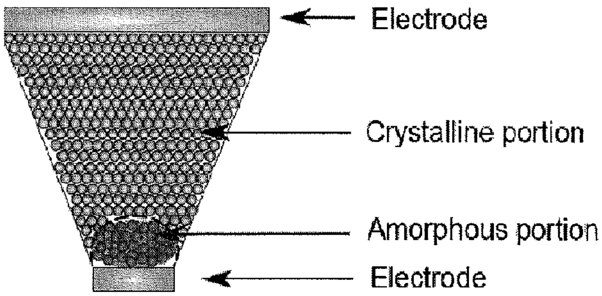
Figure 13B:
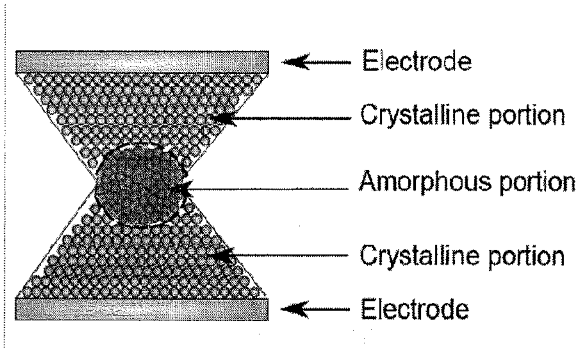
Figure 14A:
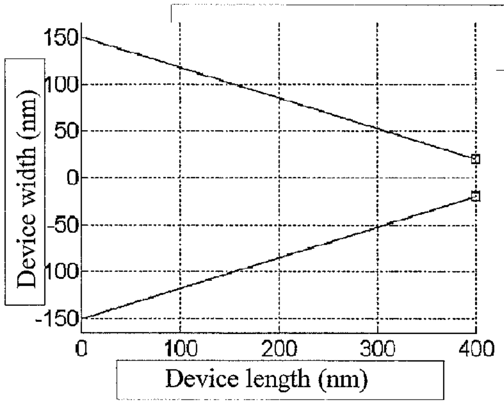
Figure 14B:
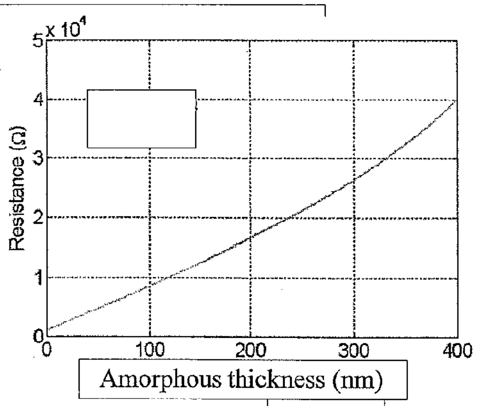
Figure 15A:
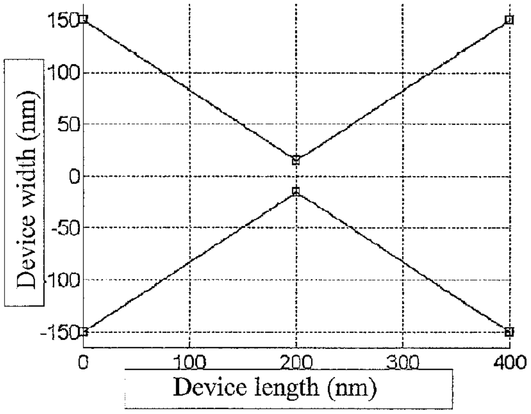
Figure 15B:
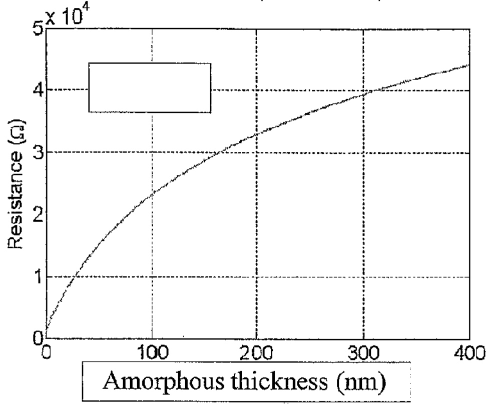
Figure 16:
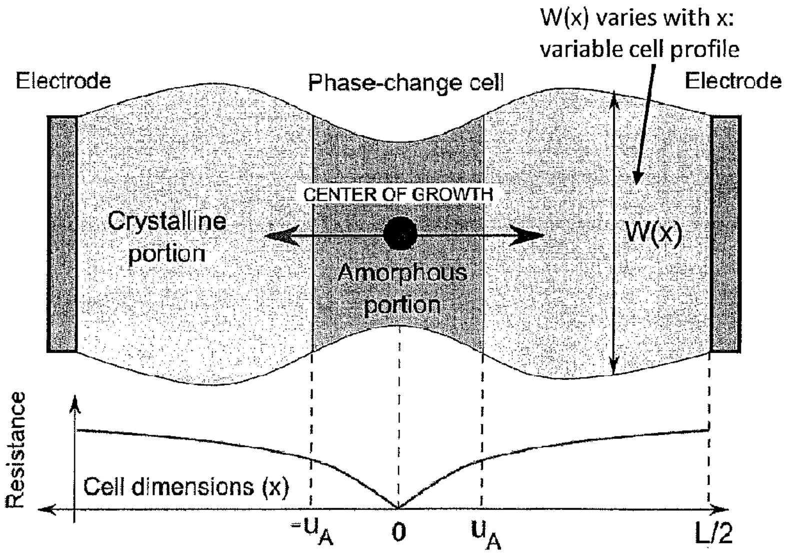
Figure 17A:
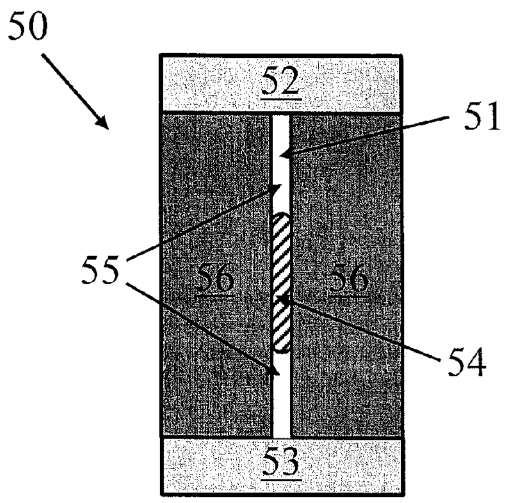
Figure 17B:
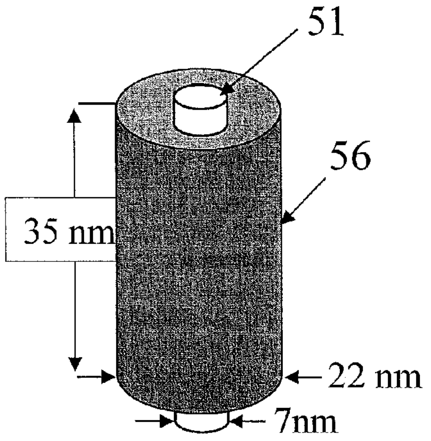
Figure 18:
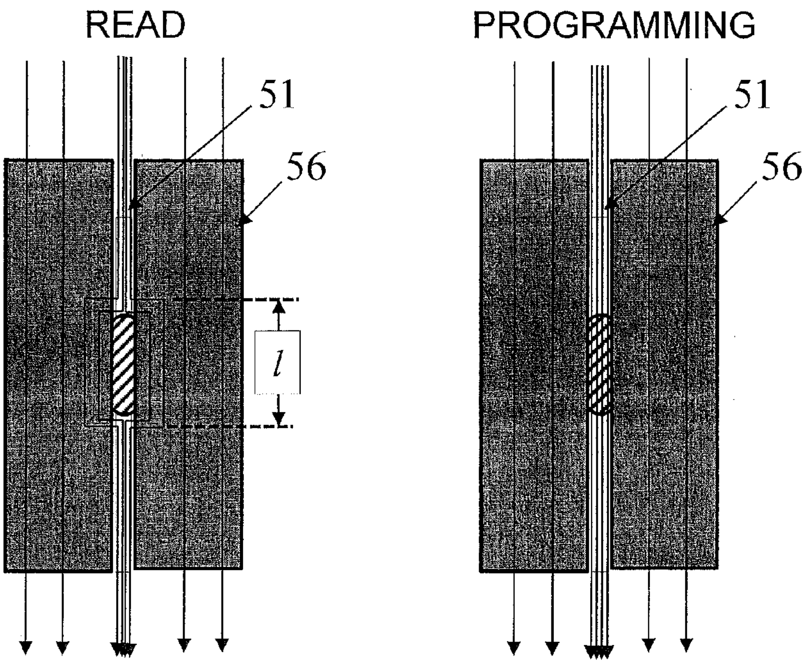
Figure 19:
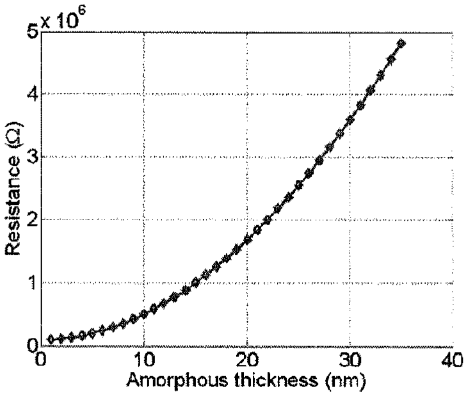
Figure 20A:
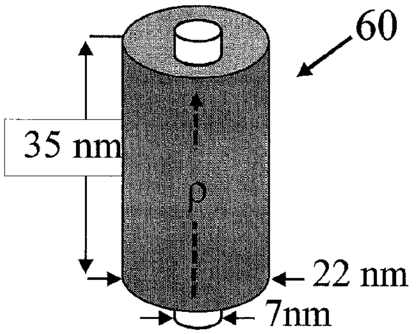
Figure 20B:
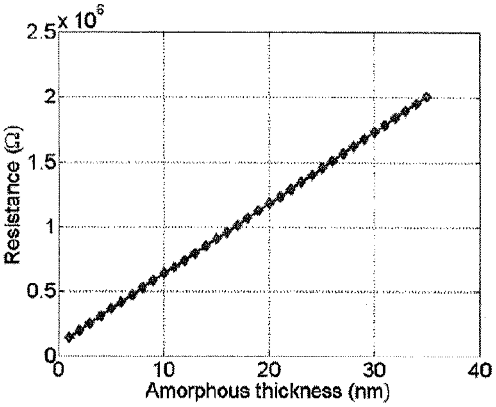
Figure 21A:
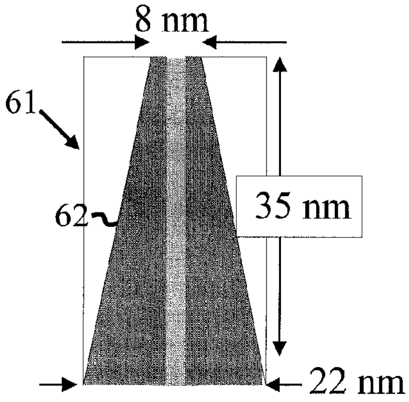
Figure 21B:
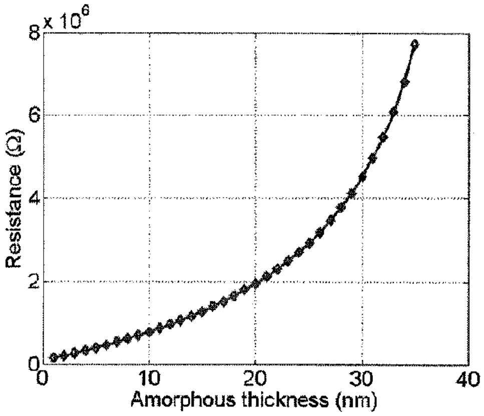
Figure 22A:
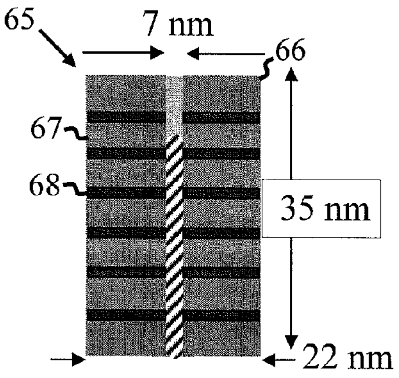
Figure 22B:
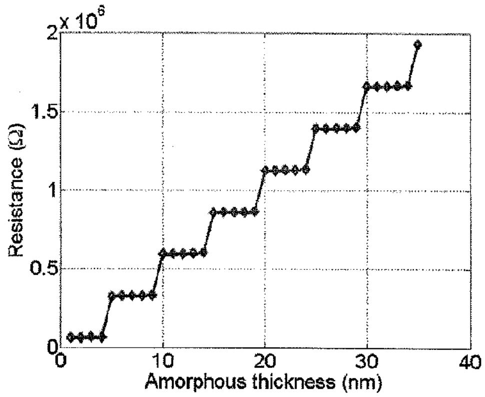
Figure 23:
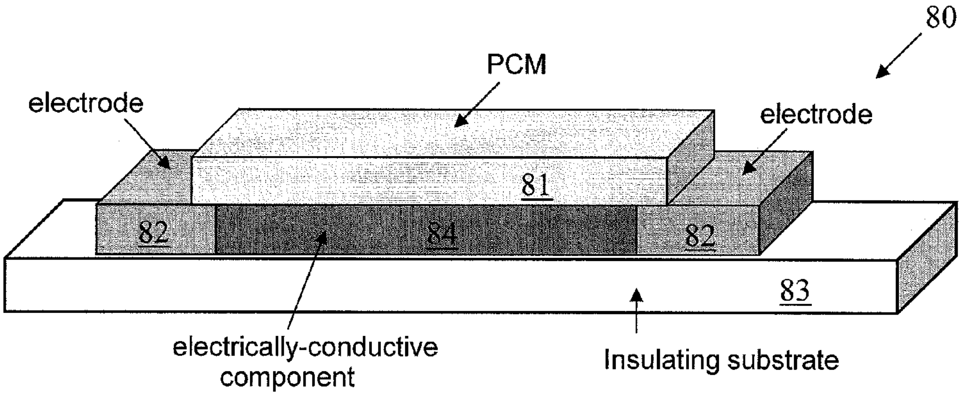
Figure 24:
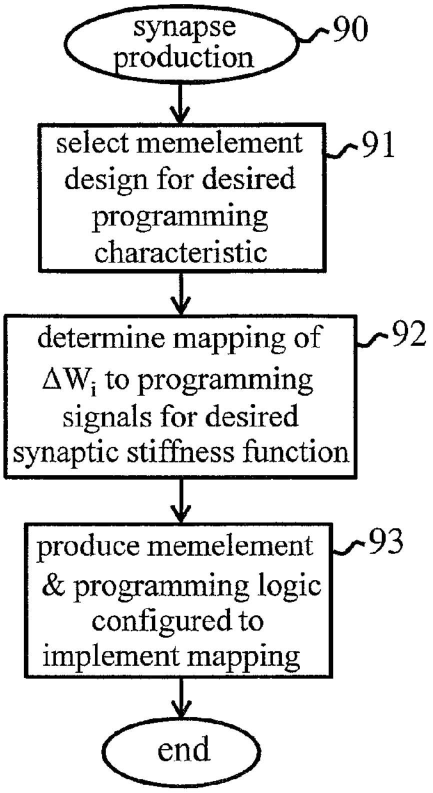
Figure 25:
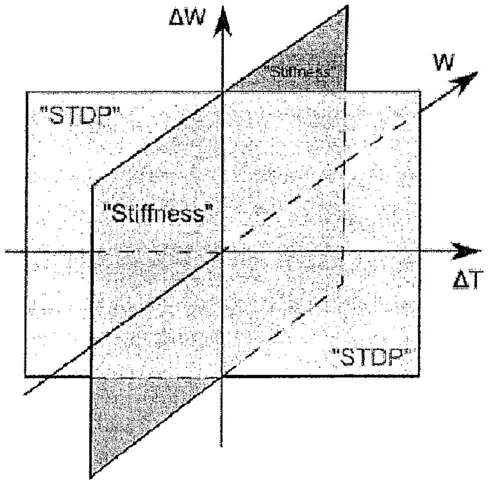

FIGS. 6*a* to 6*c* illustrate operating characteristics in an exemplary operating mode of the FIG. 5 device;

FIGS. 7*a* and 7*b* illustrate modifications to the operating mode of FIG. 5;

FIG. 8 illustrates progressive internal crystallization in one operating mode of a PCM cell;

FIG. 9 indicates the effect of peripheral crystallization in another operating mode of a PCM cell;

FIGS. 10*a* to 10*c* show exemplary operating characteristics for an operating mode based on peripheral crystallization;

FIGS. 11*a* and 11*b* indicate variability in programming characteristics based on internal and peripheral crystallization;

FIG. 12 illustrates variation in operating characteristics of a PCM mushroom cell with different electrode dimensions;

FIGS. 13*a* and 13*b* are schematic illustrations of different types of PCM cell;

FIGS. 14*a* and 14*b* indicate dimensions and operating characteristics respectively for an exemplary PCM funnel cell;

FIGS. 15*a* and 15*b* indicate dimensions and operating characteristics respectively for an exemplary PCM taper cell;

FIG. 16 is a generalized schematic indicating effect of shape-modulation in a PCM cell;

FIGS. 17*a* and 17*b* are schematic views of an alternative PCM cell which exploits a conductive component for cell operation;

FIG. 18 indicates operation of the cell of FIG. 17*a* in read and programming modes respectively;

FIG. 19 indicates an operating characteristic for one example of a PCM cell with conductive component;

FIGS. 20*a* and 20*b* respectively show a modification to the conductive component of a PCM cell and an operating characteristic obtained with this modification;

FIGS. 21*a* and 21*b* respectively show another modification to the conductive component and an operating characteristic obtained with this modification;

FIGS. 22*a* and 22*b* respectively show a further modification to the conductive component and an operating characteristic obtained with this modification;

FIG. 23 shows another configuration of a PCM cell with conductive component;

FIG. 24 indicates steps in realization of synapse apparatus embodying the invention; and FIG. 25 indicates the orthogonal relationship of STDP and weight-dependent update efficacy obtained with embodiments of the invention.

Figure 1:
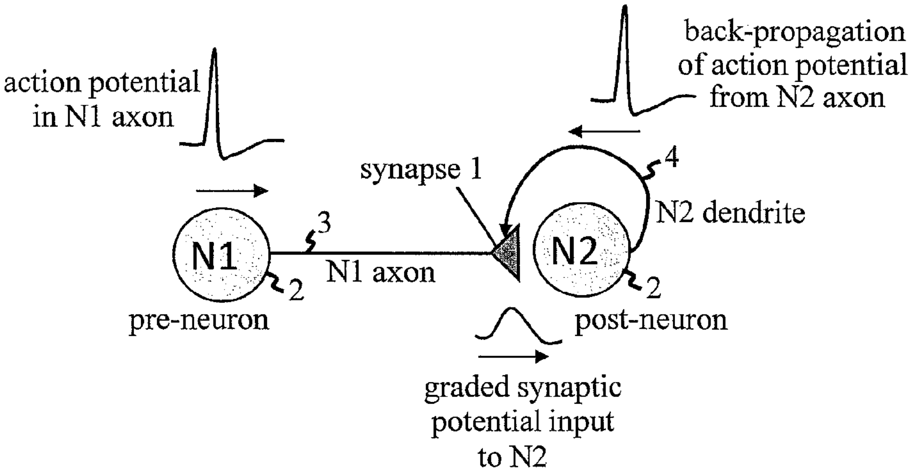
FIG. 1 is a schematic representation of a biological synapse system.
Figure 2:
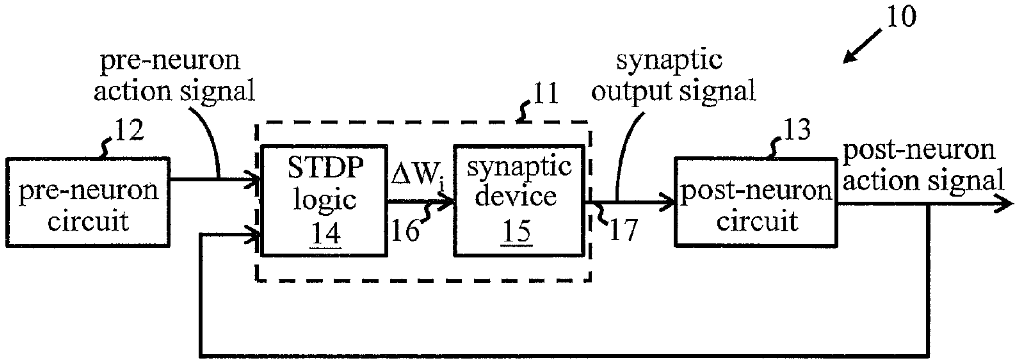
FIG. 2 is a schematic illustration of a neuromorphic system embodying the invention.

FIG. 2 is a schematic representation of a neuromorphic system 10 embodying the invention. The system 10 comprises synapse apparatus, indicated generally at 11, connected between a pre-neuron circuit 12 and a post-neuron circuit 13. The synapse apparatus 11 comprises STDP logic 14 and a synaptic device 15. The STDP logic 14 is connected to receive pre-neuron and post-neuron action signals from the pre- and post-neuron circuits respectively. The synaptic device 15 has an input terminal 16 for receiving an input signal from STDP logic 14, and an output terminal 17 connected to the post-neuron circuit 13. The synaptic device provides mechanisms for storing a synaptic weight and for implementing synaptic plasticity as described in detail below.

In operation, the pre- and post-neuron circuits generate their respective action signals at arbitrary timings dependent on inputs (not shown) from other neuron circuits in a computational arrangement of which system 10 forms part. Each neuron circuit typically accumulates inputs from its connected circuits and "fires", generating its output action signal, if the accumulated inputs exceed a threshold value. In a typical arrangement, system 10 may form part of an array of interconnected neuron circuits, with each circuit being connected to a plurality of the other neuron circuits via respective synapses, each implemented by apparatus 11. The STDP logic 14 receives the pre-neuron and post-neuron action signals and provides an output dependent on these signals to synaptic device 15. This output serves as a stimulus for prompting update of the synaptic weight stored in device 15. The STDP logic output depends on relative timing of the pre- and post-neuron action signals. In this preferred embodiment, the STDP logic 14 is adapted to generate a weight-change value $\Delta W_i$ in dependence on time-difference between the received action signals. This value $\Delta W_i$ is communicated via an input signal to device 15. The input weight-change value $\Delta W_i$ indicates a desired change of synaptic weight based on the action signal timing as determined by a spike timing-dependent plasticity rule implemented by STDP logic 14. In general, any desired STDP rule may be implemented here as required for a given computational application. By way of example, a simple STDP system may be constructed in known manner based on summation of differently-shaped pre- and post-neuron signals, illustrative examples being descried in the Kuzum, Jackson, and Eryilmaz references above. However, relative timing of the action signals, and the resulting weight-change value $\Delta W_i$, might be determined in numerous ways in STDP logic 14 and suitable implementations will be readily apparent to those skilled in the art.

The synaptic device 15 receives the input weight-change value $\Delta W_i$ at input terminal 16. In response to this stimulus, the stored synaptic weight is updated in device 15. In addition, device 15 generates an output signal which is dependent on the synaptic weight. This signal corresponds to the propagated synaptic potential and is provided via output terminal 17 to post-neuron circuit 13. The structure and operation of synaptic device 15 is described below with reference to FIG. 3.

Figure 3:
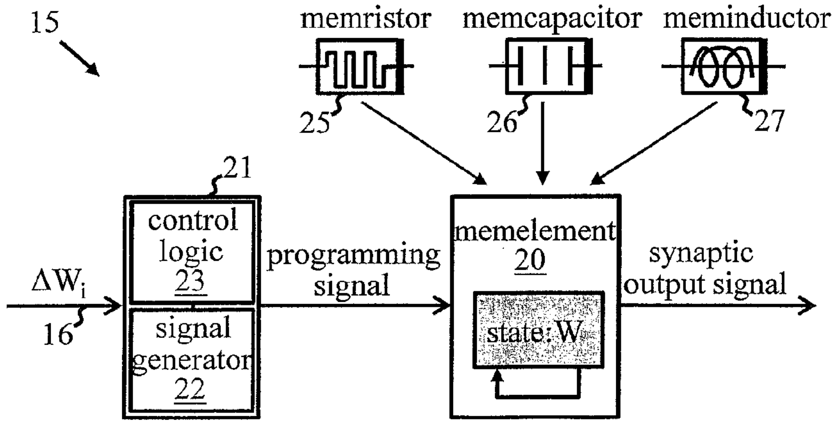
FIG. 3 is a schematic block diagram of a synaptic device in the FIG. 2 system.

FIG. 3 is a schematic block diagram illustrating a preferred embodiment of synaptic device 15. The device 15 comprises a memelement 20 for storing a synaptic weight, and programming logic indicated generally at 21. The programming logic 21 is connected to input terminal 16, and is responsive to the input signal from STDP logic 14 to generate a programming signal for programming the memelement to update the synaptic weight. In the preferred embodiments to be described, the programming signal comprises one or more programming pulses produced by a signal generator 22 of the programming logic. The form of each programming signal is dependent on the input weight-change value $\Delta W_i$. In particular, control logic 23 controls operation of the signal generator 22 such that the pulse characteristics for respective programming signals depend on the corresponding input weight-change values $\Delta W_i$. In general, control logic 23 may be implemented in hardware or software or a combination thereof, and suitable implementations will be apparent to those skilled in the art from the description of operation herein.

Figure 4:
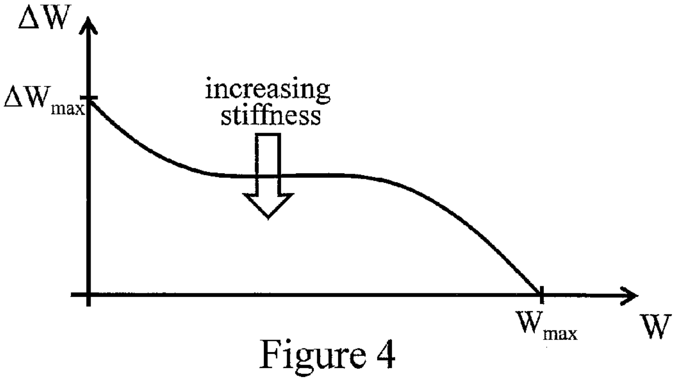
FIG. 4 illustrates an arbitrary weight-dependent synaptic efficacy rule.

The memelement 20 may be implemented by a memristor 25, a memcapacitor 26 or a meminductor 27 as indicated schematically in FIG. 3. Many implementations of such devices are known, but it is a common feature of all such devices that evolution of the internal physical state which determines the device resistance, capacitance or inductance, as appropriate, depends on the current state and history of the device inputs. In effect, therefore, the internal physical state of these devices exhibits an inherent feedback property. This physical state is used to store the synaptic weight W in synapse device 15. The resulting feedback property of the stored weight W, indicated schematically by the arrow in memelement 20, is exploited as a basis for implementing weight-dependent synaptic update efficacy in device 15. In particular, by appropriate tailoring of features discussed below, the memelement is adapted to exhibit a desired programming characteristic. The metric used as an indication of internal state (i.e. measured values dependent on resistance, capacitance or inductance, as appropriate) thus varies in a defined manner with programming signal parameters controlled by control logic 23. Due to the feedback property of the memelement, the effective change in synaptic weight ΔW produced by a given programming signal depends on the current synaptic weight W at any time. In addition, by appropriate mapping of input weight change values $\Delta W_i$ to programming signal characteristics in control logic 23, the programming logic is adapted such that the resulting programming signals exploit the defined programming characteristic of memelement 20 to provide a desired weight-dependent synaptic update efficacy. In this way, synaptic device 15 can in principle be tailored to implement any desired weight-dependent efficacy rule. An analogy can be drawn here between synaptic efficacy and mechanical stiffness, which determines change in mechanical size of a body in response to an applied force. Hence, a rule defining a particular weight-dependent synaptic update efficacy can be viewed as a "synaptic stiffness" function. FIG. 4 is a simple illustration of an arbitrary synaptic stiffness function defined by an arbitrary relation between effective weight-change ΔW and synaptic weight W for a given stimulus ($\Delta W_i$). The weight change ΔW is positive here in the case of synaptic potentiation, and negative in the case of synaptic depression. By appropriate tailoring of programming signals and characteristics in the FIG. 3 apparatus, the curve of FIG. 4 can be shaped to give a desired synaptic stiffness function. How parameters can be varied to tailor the stiffness function will be explained in more detail below.

In addition to programming of memelement 20, the programming logic 21 is further adapted to control the memelement for producing the synaptic output signal at output terminal 17. Hence, in a read mode of operation, control logic 23 controls signal generator 22 to apply a read signal to memelement such that the resulting output signal at terminal 17 is dependent on the stored synaptic weight. The read signal may be predetermined current or voltage pulse depending on the nature of memelement 20, with the resulting read metric indicated by the synaptic output signal corresponding to the quantity (resistance, capacitance or inductance as appropriate) which expresses synaptic weight.

FIG. 5 shows an exemplary implementation of synaptic device 15 using a PCM cell as a memristor implementation of memelement 20. PCM cells are well-known examples of nanoelectronic memristors. These cells exploit the variable resistance characteristics of a volume of chalcogenide material, such as GST (Germanium-Antimony-Tellurium), which is disposed between a pair of electrodes. The programmable-resistance is achieved by heating the chalcogenide material so as to change the relative proportions of a (high-resistance) amorphous phase and a (low-resistance) crystalline phase in the chalcogenide volume. The heating-induced phase-change is achieved by application via the electrodes of programming signals above a threshold voltage required for phase-change. The cell-resistance can read by applying a low-voltage read signal to the electrodes and measuring the resulting current flow through the cell. The read voltage level is low enough to ensure that the read voltage does not disturb the programmed cell-state.

The synaptic device 30 of FIG. 5 comprises a PCM cell 31, together with programming logic 32 comprising a pulse generator 33 and control logic 34 generally as described above. The PCM cell 31 is of the "mushroom cell" type, having a chalcogenide material 35 between a first electrode 36 and a second, smaller electrode 37. The small electrode 37 serves as a heater for heating the chalcogenide 35 so as to change the size of a high-resistance amorphous dome 38 within the remaining low-resistance crystalline material 39. By application of suitable programming pulses via programming logic 32, the size of amorphous dome 38 (represented schematically as $u_a$ in the figure) can be varied to change the cell resistance and hence the stored synaptic weight. The programming logic can also apply a low-voltage read signal whereby the resulting current flowing through the cell provides the synaptic output signal dependent on synaptic weight. On receipt of an input signal $\Delta W_i$, the programming logic may effect generation of the synaptic output signal immediately before or immediately after cell programming to update the synaptic weight.

In this embodiment, the interdependence of synaptic weight-change ΔW and current synaptic weight W which determines the stiffness function can be achieved by exploiting the nucleation, crystallization and amorphization dynamics of the phase-change material 35. FIGS. **6*a* to 6*c* illustrate a simple example of operation of device 30 based on progressive crystallization of PCM cell 31. FIG. 6*a* illustrates a sequence of programming pulses produced by pulse generator 33 under control of control logic 34. An initial pulse 40 (pulse number 0) has a high amplitude of 6V and a duration of 1000 nanoseconds, with a 6-nanosecond trailing edge. This pulse serves to "reset" the cell to its highest-resistance state prior to operation. In this reset state, the amorphous dome typically extends over a substantial area of the cell between electrodes 36, 37. The fifteen subsequent pulses 41, which are applied for programming the cell to update synaptic weight, each have a lower amplitude of 2V and a duration of 60 ns with a 6 ns trailing edge. FIG. 6*b* shows a programming characteristic of cell 31 in terms of variation of cell conductance, equivalent to synaptic weight here, in micro-Siemens with application of the 15 pulses. In this simple example, control logic 31 can map an input weight-change value $\Delta W_i$ to a number n of programming pulses 41 to produce a programming signal for updating the synaptic weight. If the mapping is such that n is proportional to $\Delta W_i$ with a fixed constant of proportionality, then a synaptic stiffness function as shown in FIG. 6*c* can be achieved in device 30**.

The programming characteristic of FIG. 6*b* can be varied by adjusting the amplitude, duration and trailing edge of the programming pulses to achieve different stiffness functions. As illustration, FIGS. 7*a* and 7*b* show examples corresponding to FIGS. 6*a* and 6*b* with different pulse parameters. The programming pulses can also be adapted to exploit different physical processes underlying the state-change mechanism in cell 31. For instance, in the examples of FIGS. 6*a* to 7*b*, the programming pulses are designed such that increasing conductance is primarily due to crystal nucleation and growth within the amorphous volume 38. This process is illustrated schematically in FIG. 8 which shows development of a crystalline "percolation path" through the amorphous material with increasing number of programming pulses. In other embodiments, synaptic potentiation can be based primarily on crystal growth velocity at the periphery of the amorphous dome. This process is illustrated schematically in FIG. 9, where the arrows indicate progressive peripheral crystallization. This can be achieved by designing the programming pulses so that the center of the amorphous dome stays molten during programming. An example of such a programming pulse sequence is shown in FIG. 10*a*. Here, the higher pulse amplitude compared to FIG. 6*a* provides the higher power necessary for peripheral crystallization. FIG. 10*b* shows a resulting programming characteristic and FIG. 10*c* a corresponding stiffness function. Exploiting peripheral crystallization offers reduced variability in cell dynamics as demonstrated by FIGS. 11*a* and 11 *b*. FIG. 11*a* illustrates variability in programming characteristics based on 100 measurement runs in an example based on internal crystallization. FIG. 11*b* shows the substantially reduced variability obtained in an example based on peripheral crystallization.

Note that the above examples use simple programming characteristics based on a single parameter, i.e. number of pulses, of the programming signals. In general, however, a programming characteristic can be defined for variation of $m\geq1$ parameters such as number of pulses, pulse amplitude, duration, form and duration of leading and trailing edges, etc. With $m\geq1$, the resulting programming characteristic can be viewed as an m-dimensional surface as opposed to the simple "one-dimensional" characteristics above. A programming pulse sequence with varying pulse parameters may be defined in control logic 34 so as to plot a desired trajectory across this surface, and thereby obtain a desired synaptic stiffness function. In general, the control logic 34 can be adapted such that each programming signal generated for an input $\Delta W_i$ value comprises a respective set of n programming pulses, with at least one of the programming pulse shape and the value of n being controlled in a predetermined manner to provide the desired weight-dependent synaptic update efficacy. A given programming signal may therefore contain $n\geq1$ programming pulses, with or without an intervening time interval, where in general n may differ for different signals. Pulse shape can be controlled by adjusting various pulse parameters as described above.

Embodiments can also be envisaged in which the synaptic stiffness function is further tailored by adjusting the mapping of input weight-change values $\Delta W_i$ to pulse parameters over a sequence of programming signals. In particular, the programming logic may be adapted such that the dependence of the programming signal on an input weight-change varies in a predetermined manner over a plurality of input weight-change values so as to provide the desired stiffness function. The way in which a programming signal is produced for a given $\Delta W_i$ value may thus vary with progress across the range of synaptic weights spanned by the programming characteristic. In effect, programming signals can then be generated in a manner which is itself weight-dependent, offering additional tuning possibilities for synaptic stiffness.

In some embodiments, the programming logic may be reconfigurable in response to a control signal for dynamically varying the desired stiffness function. The control logic may receive such a control signal via input terminal 16, or via a dedicated control input, and may adapt the mapping of input weight-change values $\Delta W_i$ to programming signal parameters in a manner indicated by the control signal. This allows synaptic operation to be dynamically reconfigured, e.g. according to the nature of the input data or the desired computational properties.

The programming characteristic of memelement 20 can also be tailored via the hardware design of the element, including physical and topological features such as materials, shape, dimensions etc., of various components of the element. In PCM cells, for instance, the phase-change dynamics are intertwined with features of cell-geometry such as cell-shape and dimensions, and the dimensions of electrodes, that determine the location and form of the phase-change effect. As illustration, FIG. 12 indicates how the ratio of resistance change 6R to change in amorphous size $\delta u_a$ varies with cell resistance for different values of the heating electrode diameter $r_E$ indicated in the figure. Hence, different programming characteristics, and so stiffness functions, can be achieved by appropriate selection of electrode size. Different types of cell also exhibit different characteristics. FIGS. 13*a* and 13*b* are schematic illustrations showing basic structure of two further cell-types, a "funnel cell" and a "taper cell" respectively. These cell types offer different programming characteristics. As illustration, FIG. 14*b* indicates how cell-resistance varies with amorphous thickness $u_a$ for an exemplary PCM funnel cell with dimensions indicated by FIG. 14*a*. FIG. 15*b* indicates the different operating characteristic obtained in a PCM taper cell having dimensions indicated by FIG. 15*a*.

Programming characteristics can also be tuned via the selection of materials and adjustment of shape. For example, memelements may have a modulated shape to obtain a desired characteristic. FIG. 16 is a generalized schematic indicating effect of shape-modulation in a PCM cell. The relation between cell-resistance and amorphous size can be tailored by appropriate modulation of cell-dimensions generally orthogonal to the direction of amorphous growth here.

Materials and form of other cell-components can also be used to tailor cell characteristics. By way of example, resistive memory cells such as PCM cells and resistive random access memory (RRAM) cells can be designed to exploit an electrically-conductive component for cell operation. Examples of such cells are described in our UK patent applications no.'s 1310629.9, filed 14 Jun. 2013, and 1311671.0, filed 28 Jun. 2013, the content of which applications is incorporated herein by reference. The basic operating principle of such cells can be understood by considering the exemplary cell 50 of FIGS. 17*a* and 17*b*. FIG. 17*a* is a schematic cross-sectional view of the cell-structure shown in FIG. 17*b*. The cell 50 comprises a resistive (here PCM) material 51 located between first and second electrodes 52 and 53. The PCM material 51 is shown in the figure containing an amorphous phase, indicated by region 54, and a crystalline phase, indicated by regions 55. Cell 50 further includes an electrically-conductive component 56 extending in a direction between the electrodes in contact with the PCM material 51. The conductive component 56 comprises a layer of electrically-conductive material which extends from one electrode to the other and all around the PCM material 51. The PCM material 51 thus forms an elongate core of material within electrically-conductive layer 56 which itself forms a sheath around the PCM core. In this example, the sheath and core have a generally circular cross-section, giving a cylindrical shape, but in general these elements can be formed with any desired cross-sectional shape. Exemplary dimensions for the elements of cell 50 are indicated in FIG. 17*b*. In an exemplary implementation, the PCM element 51 may comprise GST, electrodes 22, 23 may be formed of TiN, and sheath 26 may be formed of TaN.

The programming characteristic of cell 50 is dependent on properties of the conductive component 56. In particular, the arrangement is such that the resistance presented by component 56 to a cell current produced by the read voltage is less than that of the amorphous phase 54, and greater than that of the crystalline phase 55, of the phase-change material 51 in the various programmed cell states. As a consequence, the sheath 56 presents a lower-resistance current path to the cell read current than the amorphous phase 54, and this current path has a length dependent on size of the amorphous region 54. This is illustrated in FIG. 18 which indicates operation of the cell 50 in read and programming modes respectively. Current density is indicated schematically by spacing of the vertical arrows in this figure. Due to the resistance properties described above, in a read operation as indicated on the left of the figure, the cell current flows primarily through the crystalline phase 55 of the core in preference to the sheath 56, and primarily through sheath 56 in preference to the amorphous phase 54 of the core. The resulting current path through the sheath 56 has a length l which is directly dependent on size of the amorphous phase 54, increasing as the amorphous volume expands along the length of core 51. In a programming operation, however, where a significantly higher voltage is applied between the cell electrodes, the cell current flows primarily through the core 21 as indicated on the right of the figure. The read metric (and hence synaptic output signal) obtained in the read mode thus depends on the resistive properties of conductive component 51. The programming characteristic for this type of cell thus depends on the conductive component 56.

The conductive component can be adapted in various ways to provide a desired programming characteristic in cells of this type. As illustration, FIG. 19 indicates how resistance, and hence synaptic weight, varies with amorphous size $u_a$ for an exemplary cell shown in FIG. 178*b*. In this example, the resistivity of the conductive sheath is substantially constant along its length. In contrast, FIG. 20*b* shows an equivalent operating characteristic for the similar cell 60 of FIG. 20*a* in which the resistivity ρ of the conductive sheath increases generally monotonically along its length.

The operating characteristics can also be modified by modulating dimensions of the conductive component. As illustration, FIG. 21*b* shows an operating characteristic for the cell 61 of FIG. 21*a* in which sheath resistivity is constant but diameter of the sheath 62 decreases along its length. FIG. 22*a* shows another cell 65 in which the sheath 66 comprises alternating first and second sections, 67 and 68 respectively, in the direction of the current path though the sheath. The first sections 67 are of lower resistance than the second sections 68. The second sections 68 here are of smaller thickness than the first sections 67, and the first sections 67 have a lower resistivity than the second sections 68. FIG. 22*b* indicates the effect on the operating characteristic of this modulation in the resistance per unit length of the sheath 66. The curve has a stepped shape, with the steeper sections corresponding to respective higher-resistance layers 68 and the flatter sections corresponding to the lower-resistance layers 67.

While the foregoing illustrates various ways in which conductive-component cells can be designed to tailor programing characteristics, numerous other designs can be envisaged. A further example is illustrated in FIG. 23. In this "lateral" design, the cell 80 has a layer 81 of PCM material. PCM layer 81 extends between two electrode layers 82 formed on an insulating substrate 83. The conductive component is provided by a layer of electrically-conductive material 84 formed on substrate 83 and extending from one electrode 82 to the other. Conductive layer 84 may be formed of the same material as electrodes 82 in some embodiments. Such lateral cell designs can be adapted in a similar manner to the conductive-sheath embodiments above to provide desired characteristics.

Similar principles can also be used to vary characteristics of other resistive memory cells such as RRAM cells.

It will be seen from the above that programming characteristic can be tailored in numerous ways by appropriate adaptation of the memelement design. While the foregoing focuses on resistive memory cells as exemplary memristive elements, similar principles can be applied to other memristors as well as to memcapacitors and meminductors. Many such devices exist at nanoscale dimensions as discussed in the IEEE paper of Di Ventra et al., referenced earlier. In addition to crystallization dynamics in phase-change materials, the physical process for memristor operation can be based on mechanisms such as atomic configuration and rearrangement in thin-film semiconductors, electron spin polarization, and charge trapping and tunneling in nanocrystals in oxidized amorphous films. Memristors may, for instance, be formed from thin film nanostructures, e.g. thin films of $TiO_2$ or $VO_2$. As another example, solid-state memcapacitors can be constructed from a plurality of metal layers embedded in an insulator between the plates of a capacitor as discussed in "Solid-State Memcapacitive System with Negative and Diverging Capacitance", Martinez-Rincon et al., Physical Review B, Volume 81, Issue 19, 2010. Meminductors can be constructed using a core material whose response to a field applied via the electrical conductor depends on history of the material.

The flow chart of FIG. 24 indicates basic steps in producing a neuromorphic synapse apparatus having a desired stiffness function according to the principles discussed above. The process 90 involves selection of the design of memelement 20, as indicated at step 21, including tailoring of features as described above to provide a desired programming characteristic. Step 92 represents the step of configuring the programming logic 21 to exploit the defined programming characteristic to provide a desired synaptic stiffness function. This step defines the mapping of input weight-change values $\Delta W_i$ to programming signal characteristics used by control logic 22. The memelement and appropriately-configured control logic are then produced in step 93 to provide a synapse apparatus exhibiting the desired stiffness function. The various components can be fabricated as an integrated nanoscale system, using well-known material processing techniques, as will be apparent to those skilled in the art.

The above techniques offer simple and widely-applicable neuromorphic synapse systems using non-CMOS synaptic devices to provide a desired weight-dependent synaptic update efficacy. Sophisticated synaptic weight update rules can be implemented, such as those based on polynomial functions of the synaptic weight, and these rules can be statically or dynamically tuned according to requirements. The synaptic device 15 can be implemented as a simple two terminal device with low cost and areal density requirements.

Moreover, as illustrated schematically in FIG. 25, the orthogonal implementation of STDP functionality and weight-dependent update efficacy in the above embodiments offers exceptionally flexible, fully-controlled, two-dimensional synaptic dynamics.

While preferred embodiments have been described above, many changes and modifications can of course be envisaged. By way of example, embodiments can be envisaged where the programming logic is responsive to a stimulus other than an input weight-change value $\Delta W_i$. Such a stimulus could be indicated by one or more signals. The stimulus could, for instance, be indicated by pre- and post-neuron action signals, and may depend on relative timing of these signals, to integrate STDP functionality in the programming logic operation.

Embodiments can also be envisaged where the synapse apparatus comprises more than one memelement, with the overall synaptic output being provided by a combination of the weights stored by different elements. For example, two synaptic elements may be arranged in a differential configuration to provide for bidirectional operation in generally known manner, one element providing for synaptic potentiation and the other synaptic depression.

It will be appreciated that many other changes and modifications can be made to the exemplary embodiments described without departing from the scope of the invention.

We claim:

1. Neuromorphic synapse apparatus comprising:

a memelement for storing a synaptic weight, the memelement being a phase-change memory cell adapted to exhibit a desired programming characteristic; and programming logic, responsive to a stimulus prompting update of the synaptic weight, for generating a programming signal for programming the memelement to update said weight, each said programming signal comprising a respective set of n programming pulses applied at an input electrode of said phase-change memory cell;

wherein the programming logic is adapted to control at least one of the programming pulse shape and the value of n such that the programming signals exploit said programming characteristic to provide a desired weight-dependent synaptic update efficacy.

2. Apparatus according to claim 1 wherein the programming logic is responsive to an input signal indicating an input weight-change value, the programming logic being adapted to generate a programming signal dependent on the input weight-change value.

3. Apparatus according to claim 2 including STDP logic for receiving pre-neuron and post-neuron action signals, the STDP logic being adapted to generate said input weight-change value in dependence on time-difference between said action signals.

4. Apparatus according to claim 2 including an input terminal for receiving said input signal and an output terminal for providing a synaptic output signal dependent on said synaptic weight, wherein the programming logic is further adapted to control the memelement for producing the synaptic output signal at the output terminal.

5. Apparatus according to claim 1 wherein the programming logic is responsive to an input signal indicating an input weight-change value and is adapted to generate a programming signal dependent on the input weight-change value, and wherein the dependence of the programming signal on the input weight-change value varies in a predetermined manner over a plurality of input weight-change values so as to provide the desired weight-dependent synaptic update efficacy.

6. Apparatus according to claim 1 wherein the programming logic is reconfigurable in response to a control signal for dynamically varying the desired weight-dependent synaptic update efficacy.

7. Apparatus according to claim 1 wherein the memelement has a modulated shape to provide said desired programming characteristic.

8. Apparatus according to claim 1 wherein the memelement comprises a memristor.

9. Apparatus according to claim 8 wherein the memelement comprises a resistive memory cell.

10. Apparatus according to claim 9 wherein the cell comprises a resistive material located between first and second electrodes, and an electrically-conductive component extending in a direction between the electrodes in contact with the resistive material, and wherein the electrically-conductive component is adapted to provide said desired programming characteristic.

11. Apparatus according to claim 9 wherein the programming signals are adapted to effect peripheral crystallization of an amorphous volume of said phase-change material.

12. A neuromorphic system comprising a pre-neuron circuit for generating a pre-neuron action signal, a post-neuron circuit for generating a post-neuron action signal, and synapse apparatus, the synapse apparatus comprising:

a memelement for storing a synaptic weight, the memelement being a phase-change memory cell adapted to exhibit a desired programming characteristic; and programming logic, responsive to a stimulus prompting update of the synaptic weight, for generating a programming signal for programming the memelement to update said weight, each said programming signal comprising a respective set of n programming pulses applied at an input electrode of said phase-change memory cell;

wherein the programming logic is adapted to control at least one of the programming pulse shape and the value of n such that the programming signals exploit said programming characteristic to provide a desired weight-dependent synaptic update efficacy, wherein:

the synapse apparatus includes an output terminal connected to the post-neuron circuit;

the programming logic is further adapted to control the memelement for producing a synaptic output signal, dependent on said synaptic weight, at the output terminal; and said stimulus prompting update of the synaptic weight is dependent on the pre-neuron and post-neuron action signals.

13. The system according to claim 12 wherein:

the synapse apparatus includes STDP logic for receiving the pre-neuron and post-neuron action signals, the STDP logic being adapted to generate an input weight-change value in dependence on time-difference between said action signals; and the programming logic is adapted to generate a said programming signal in response to said input weight-change value.

14. The system according to claim 12, wherein the programming logic is responsive to an input signal indicating an input weight-change value, the programming logic being adapted to generate a programming signal dependent on the input weight-change value.

15. The system according to claim 14 including STDP logic for receiving pre-neuron and post-neuron action signals, the STDP logic being adapted to generate said input weight-change value in dependence on time-difference between said action signals.

16. The system according to claim 12 wherein the programming logic is responsive to an input signal indicating an input weight-change value and is adapted to generate a programming signal dependent on the input weight-change value, and wherein the dependence of the programming signal on the input weight-change value varies in a predetermined manner over a plurality of input weight-change values so as to provide the desired weight-dependent synaptic update efficacy.

17. The system according to claim 12 wherein the programming logic is reconfigurable in response to a control signal for dynamically varying the desired weight-dependent synaptic update efficacy.

* * * * *